(12) United States Patent
Fischer (10) Patent No.: US 8,522,715 B2
(45) Date of Patent: Sep. 3, 2013

(54) METHODS AND APPARATUS FOR A WIDE CONDUCTANCE KIT

(75) Inventor: Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 1170 days.

(21) Appl. No.: 12/350,087

(22) Filed: Jan. 7, 2009

(65) Prior Publication Data

US 2009/0173389 A1     Jul. 9, 2009

Related U.S. Application Data

(60) Provisional application No. 61/019,679, filed on Jan. 8, 2008.

(51) Int. Cl.
*C23C 16/00* (2006.01)
*H01L 21/00* (2006.01)

(52) U.S. Cl.
USPC .................................. 118/723 R; 156/915

(58) Field of Classification Search
USPC ............. 118/723 E; 156/345.43, 345.44, 156/345.45, 345.46, 345.47
See application file for complete search history.

(56) References Cited

U.S. PATENT DOCUMENTS

| | | | |
|---|---|---|---|
| 6,178,919 B1 * | 1/2001 | Li et al. ...................... 118/723 E |
| 6,206,976 B1 * | 3/2001 | Crevasse et al. .............. 118/720 |
| 6,406,590 B1 | 6/2002 | Ebata et al. | |
| 6,492,774 B1 * | 12/2002 | Han et al. ................. 315/111.21 |
| 6,527,911 B1 * | 3/2003 | Yen et al. ................. 156/345.43 |
| 6,716,762 B1 | 4/2004 | Lenz | |
| 6,872,281 B1 * | 3/2005 | Chen et al. ............... 156/345.43 |
| 6,926,803 B2 * | 8/2005 | Antolik ..................... 156/345.53 |
| 2006/0011138 A1 * | 1/2006 | Kang et al. ............. 118/723 R |
| 2006/0102283 A1 * | 5/2006 | Kwon et al. ............. 156/345.24 |
| 2006/0112878 A1 * | 6/2006 | Ni et al. .................... 118/723 E |
| 2008/0149596 A1 * | 6/2008 | Dhindsa et al. ................. 216/67 |

FOREIGN PATENT DOCUMENTS

| | | |
|---|---|---|
| JP | 61-216435 A | 9/1986 |
| JP | 2001-085414 A | 3/2001 |

OTHER PUBLICATIONS

"International Search Report", Issued in PCT Application No. PCT/US2009/030373: Mailing Date: Jul. 31, 2009.
"Written Opinion", Issued in PCT Application No. PCT/US2009/030373; Mailing Date: Jul. 31, 2009.
"International Preliminary Report on Patentability", Issued in PCT Application No. PCT/US2009/030373; Mailing Date: Jul. 22, 2010.

* cited by examiner

*Primary Examiner* — Sylvia R MacArthur
*Assistant Examiner* — Anna Crowell
(74) *Attorney, Agent, or Firm* — Klintworth & Rozenblat IP LLC (57) ABSTRACT

An apparatus for controlling gas flow conductance in a plasma processing chamber being configured with an upper electrode disposed opposite a lower electrode adapted to support a substrate is provided. The apparatus includes a ground ring configured to include a first set of radial slots formed therein. The apparatus also includes a confinement ring arrangement which includes at least a first set of collapsible confinement rings and a second set of collapsible confinement rings which is configured to movably couple to the first set of collapsible confinement rings. The apparatus further includes a mechanism configured at least to collapse and to expand the first set of collapsible confinement rings and the second set of collapsible confinement rings to control gas flow conductance through the first set of radial slots between (a) an unobstructed gas flow, ON state, and (b) an obstructed gas flow, OFF state.

24 Claims, 4 Drawing Sheets

METHODS AND APPARATUS FOR A WIDE CONDUCTANCE KIT

This application claims benefit of priority under 35 U.S.C. 119 from U.S. Provisional Application No. 61/019,679, filed Jan. 8, 2008 and entitled "METHODS AND APPARATUS FOR A WIDE CONDUCTANCE KIT."

BACKGROUND OF THE INVENTION

Advances in plasma processing have facilitated growth in the semiconductor industry. The semiconductor industry is a highly competitive market. The ability for a chip manufacturing company to be able to process a substrate in different processing conditions may give the manufacturing company an edge over the competitor. Thus, manufacturing companies have dedicated time and resources to identify methods and/or arrangements for improving substrate processing.

A typical processing system that may be employed to perform substrate processing may be a capacitively-coupled plasma (CCP) processing system. The plasma processing system may be built to enable processing in a number of process parameters each of them having a wide range. However, in recent years, the types of devices that may be processed have become more sophisticated and may require more process control. For example, devices being processed are becoming smaller with finer features and may require more precise control of plasma parameters, such as plasma density and uniformity across the substrate, for better yield. Gas flow across the substrate is an example of a process parameter affecting etch profile and etch rate uniformity.

Figure 1:
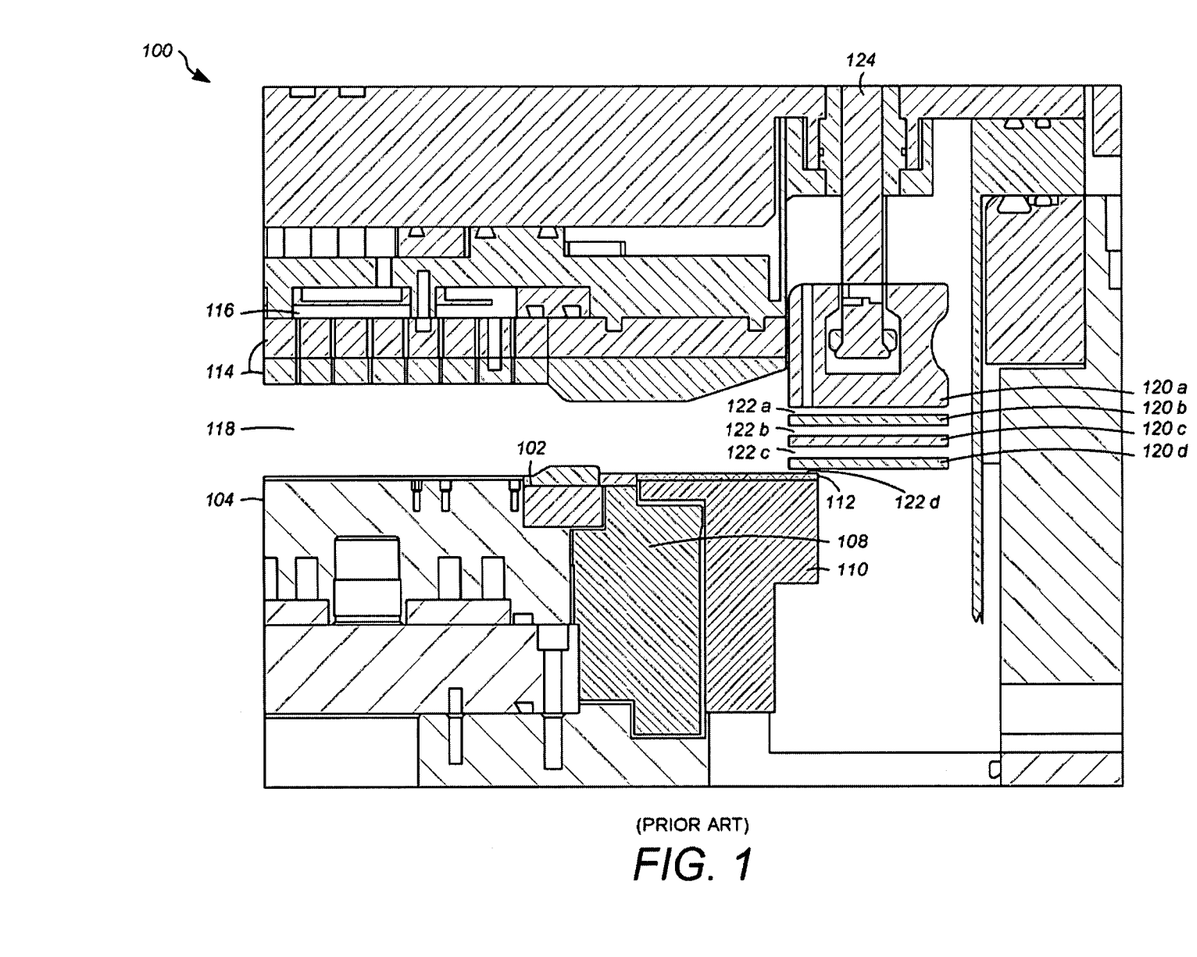
FIG. 1 shows a simplified schematic of a prior art plasma processing chamber.

To facilitate discussion, FIG. 1 shows a simplified schematic of a prior art plasma processing chamber. Plasma processing system 100 may be a single, double, or triple or multiple frequency capacitively discharged system. For example, radio frequencies (RF) may include, but are not limited to, 2, 27 and 60 megahertz (MHz). It may also be an inductively coupled system (ICP) or a CCP-ICP hybrid.

In the example of FIG. 1, a lower electrode assembly may be configured with at least a focus ring 102 and a chuck 104 for holding a substrate (not shown to simplify illustration) in place during plasma processing. The chuck 104 may be an electrostatic chuck (ESC), for instance, and may be supplied with RF power by an RF power supply (not shown to simplify illustration). A ground extension ring 110, which may be made from aluminum, may be separated from focus ring 102 by an RF insulator ring 108. Ground extension ring 110 may be covered by a cover ring 112, which may be made from quartz, to protect aluminum ground extension ring 110 from plasma during plasma processing.

As shown in the example of FIG. 1, an upper electrode assembly may be configured with at least an upper electrode 114, which may be built like a shower head. The upper electrode 114 may be grounded (not shown to simplify illustration).

During plasma processing, gas flow may be supplied via a conduit (not shown) and may pass through a gas distribution manifold 116. The gas may be electrically excited into plasma in a chamber gap 118. Plasma may be confined by a set of confinement rings (120a, 120b, 120c, and 120d). Neutral gas species may pass through a set of confinement-ring gaps (122a, 122b, 122c, and 122d), configured between the set of confinement rings (120a-d), and may be exhausted from the chamber through a valve in the wall by a vacuum pump (not shown).

In the example of FIG. 1, the plasma processing pressure may be determined by the gas conductance, i.e., the set of confinement-ring gaps (122a-d) to provide the gas flow. The overall gas flow conductance of the flow path from the gas distribution manifold to the exhaust mats depend on several factors, including but not limited to, the number of confinement rings and the size of the gaps between the confinement rings. For example, in a confined plasma reactor with very small chamber gap 118, the number of confinement rings in a set of confinement rings may be limited by the spatial constraint of the very small chamber gap 118. Each confinement-ring gap in the set of confinement-ring gaps (122a-d) may be adjustable by a shaft 124. The gaps may be controlled by the advance of shaft 124. As shaft 124 moves lower, confinement ring 120d may sit on the outer shoulder of ground extension 112 and gaps 122 may be collapsed, in order 122c, 122b, and 122a.

Consider the situation wherein, for example, a leading-edge process application requiring an ultra-short gas residence time where one or more steps of the process may require flow conductance levels that exceed the maximum capacity of the gap control. In such a process, the substrate (not shown) may need to be unloaded from the plasma processing chamber 100 and processed in another chamber that can provide the required flow conductance.

As may be appreciated from the foregoing, the shorter gas residence times may require an increase in gas conductance across the substrate through the processing chamber. However, the gas conductance may be limited by the hardware features, e.g., the number of confinement rings in a set of confinement rings and/or the size of the gaps between a set of confinement rings, for confining plasma in processing chamber with very small chamber gap. Given the need to stay competitive in the semiconductor industry, enhancement to the capability of capacitively coupled plasma processing systems are highly desirable.

SUMMARY OF INVENTION

The invention relates, in an embodiment, to an apparatus for controlling gas flow conductance in a plasma processing chamber. The plasma processing chamber configured with an upper electrode disposed opposite a lower electrode adapted to support a substrate. The apparatus includes a ground ring configured to concentrically surround the lower electrode, the ground ring includes a first set of radial slots formed therein. The apparatus also includes a confinement ring arrangement. The confinement ring arrangement includes at least a first set of collapsible confinement rings and a second set of collapsible confinement rings, the second set of collapsible confinement rings is configured to movably couple to the first set of collapsible confinement rings. The apparatus further includes a mechanism configured at least to collapse and to expand the first set of collapsible confinement rings and the second set of collapsible confinement rings to control gas flow conductance through the first set of radial slots between (a) an ON state in which a gas flow through the first set of radial slots is unobstructed by, the second set of collapsible confinement rings, and (b) an OFF state in which the gas flow through the first set of radial slots is obstructed by the second set of collapsible rings.

The above summary relates to only one of the many embodiments of the invention disclosed herein and is not intended to limit the scope of the invention, which is set forth is the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Due to the competitive advancement in the semiconductor industry, a significant number of leading-edge process applications in plasma processing may require processing steps with ultra short process gas residence times. Shorter residence times may require an increased gas conductance range which may be a trade-off with hardware features for confining plasma. To increase gas conductance in a very small chamber gap, prior art may employ fixed, bypass gas flow paths to conduct a significant fraction of the exhausted process gas away from the confinement rings. However, a rotable, quartz choke ring may be needed to regulate, i.e., to turn ON or OFF, the increased gas flow conductance through bypass gas flow paths.

By employing the choke ring to regulate gas flow, additional hardware and/or software may be required to control the movement of rotable, choke ring. The inventor herein realized that existing, confinement-ring assembly may be modified to regulate increased gas flow through expanded, gas flow conductance assembly while controlling pressure in processing chamber.

In accordance with embodiments of the invention, there are provided methods and arrangements for configuring plasma processing systems to enhance control over plasma processing parameters. Embodiments of the invention include employing a modified, confinement-ring assembly configured with a plurality of confinement-ring sets to control the expanded, gas flow conductance and the pressure in a plasma processing chamber. With more sophisticated control of the plasma processing parameters, such as regulating expanded gas flow and/or controlling pressure, the plasma processing regime may be expanded while still maintaining control of plasma confinement to obtain high yield in processing devices.

In an embodiment, the plasma processing system may be configured with the modified, confinement-ring assembly to include at least a plurality of collapsible, confinement-ring sets. In an embodiment, the plurality of the confinement-ring sets may include at least an upper confinement-ring (UCR) set and/or a lower confinement-ring (LCR) set in contrast to state-of-the-art confinement-ring assembly. Typically, a state-of-the-art confinement-ring assembly may be configured with one set of confinement rings to confine plasma.

In an embodiment, the upper confinement-ring set may comprise of an upper confinement-ring gap control assembly. In an embodiment, the UCR gap control assembly may comprise of an upper confinement-ring shaft. The upper confinement-ring shaft may be coupled to an upper confinement-ring piston being configured with at least an o-ring. The upper confinement-ring piston may be disposed inside an upper confinement-ring chamber. The upper confinement-ring piston mar move up and/or down, corresponding to the movement of the upper confinement-ring shaft, inside upper confinement-ring chamber providing a mechanism to control the gaps of upper confinement-ring set.

In an embodiment, the lower confinement-ring set may comprise of a lower confinement-ring gap control assembly. In an embodiment, the LCR gap control assembly may comprise of a lower confinement-ring piston being configured with at least an o-ring. The lower confinement-ring piston may be coupled to a lowest ring of the upper confinement-ring set. The lower confinement-ring piston may be disposed inside a lower confinement-ring chamber. The lower confinement-ring piston may move up and/or down, corresponding to the movement of the lowest ring of the upper confinement-ring set, inside lower confinement-ring chamber providing the mechanism to control the gap of lower confinement-rings set.

In the OFF position, the modified confinement-ring assembly may be configured with the lower confinement-ring set in a collapsed state, in an embodiment. The collapsed, lower confinement-ring set may rest on the shoulder of a quartz covered ground ring shutting off the bypass gas flow slots, in an embodiment. The gas species from the chamber math be forced to flow through the gaps of the upper confinement rings. In an embodiment, the gaps of the upper confinement ring may be controlled by the upper confinement gap control assembly. In the OFF position, the modified confinement-ring assembly may provide the chamber with high pressures and/or low gas flow rates. Thus, the gas flow through expanded, gas flow conductance paths may be shut off with the collapsed configuration of the LCR set while pressure through the processing chamber may be controlled by adjusting the height of the gaps of the UCR set by employing the modified, confinement-ring assembly without the need for a rotable, bypass choked ring.

In the ON position, the modified confinement-ring assembly may be configured where the upper confinement-ring set may be pulled out of the gas flow path and the lower confinement-ring set may be positioned in the gas flow path, in an embodiment, while opening up the expanded gas flow conductance path opening up the gas flow bypass. In the ON position, pressure in the chamber may be controlled by adjusting the position of lower confinement-ring set along the height of the chamber gap. In the ON position, the modified confinement-ring assembly may provide the chamber with low pressure and/or high gas flow rate. Thus, the expanded gas flow conductance paths may be opened by moving the LCR above the exhaust of the bypass while wafer area pressure may be controlled by adjusting the vertical position of the LCR set by employing the modified, confinement-ring assembly without the need for a rotable, bypass choke ring.

By employing a modified, confinement-ring assembly, the rotable, bypass choke ring may be eliminated from the expanded, gas flow conductance assembly, as required in the prior art to regulate gas flow. Thus, the actuator, I/O ports and/or software required to control the expensive rotable, bypass choke ring may also be eliminated.

The features and advantages of the present invention may be better understood with reference to the figures and discussions (with prior art mechanisms and embodiments of the invention contrasted) that follow.

Figure 2:
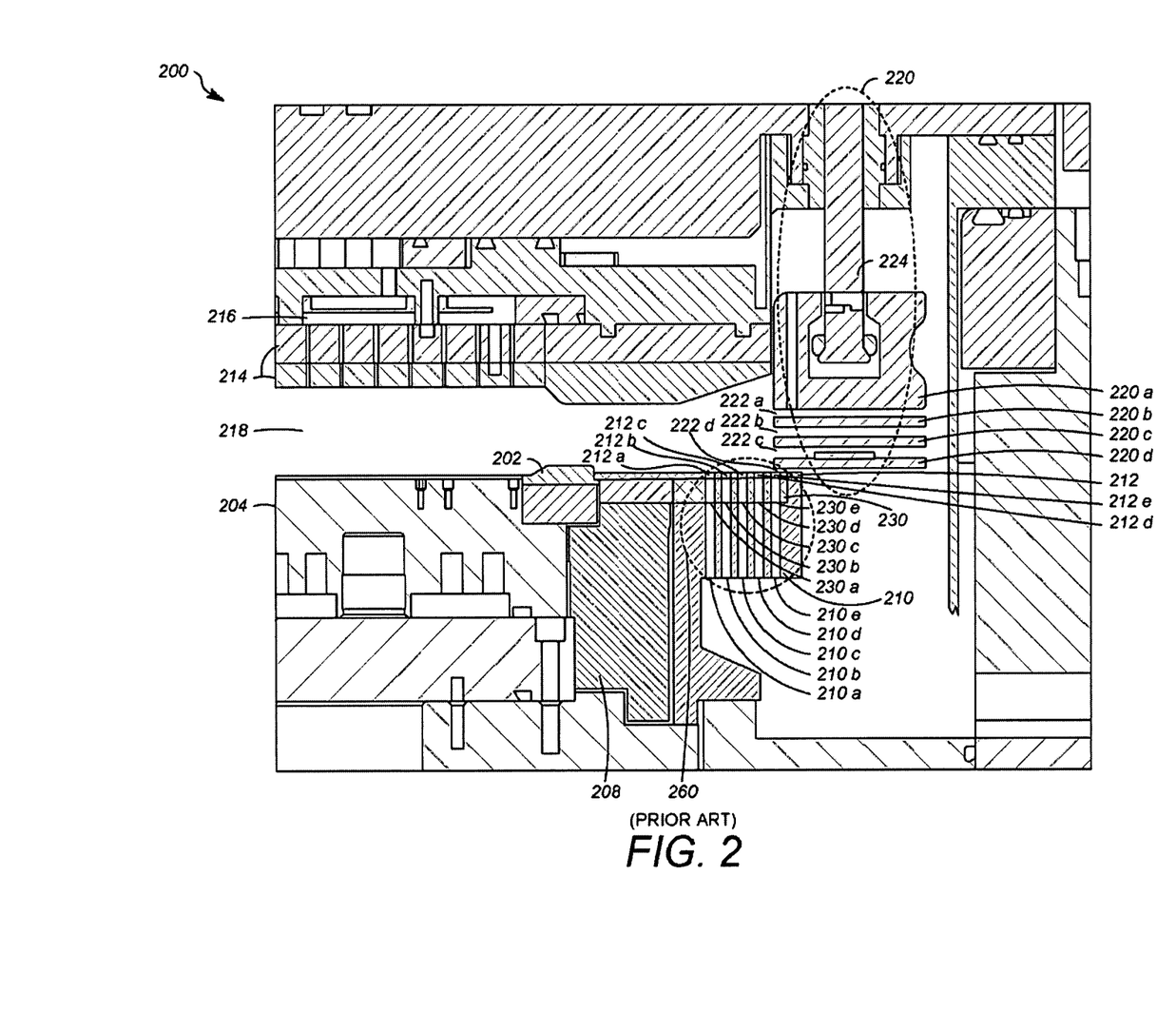
FIG. 2 shows a simplified schematic of a prior art plasma processing system configured to provide an expanded, gas flow conductance range with rotable, choke ring to regulate expanded gas flow, rotable choke ring is not shown.

FIG. 2 shows a simplified schematic of a prior art plasma processing system configured to provide an expanded, gas flow conductance range with rotable, choke ring to regulate expanded gas flow, rotable choke ring is not shown. Plasma processing system 200 may be a single, double or triple or multiple frequency capacitively discharged system. For example, radio frequency may include, but are not limited to, 2, 27 and 60 MHz.

In the example of FIG. 2, plasma processing system 200 may be configured with an upper electrode assembly and a lower electrode assembly. The lower electrode assembly may be configured with a chuck 204 that holds a substrate (not shown to simplify illustration) in place during plasma processing. The upper electrode assembly and lower electrode assembly may be separated from each other by a chamber gap 218. The upper electrode assembly may include an upper electrode 214, which may be built like a shower head. The upper electrode 214 may be grounded (not shown to simplify illustration).

The upper electrode assembly of FIG. 2 may be configured with a gas distribution manifold 216 through which processed gas (not shown) may be supplied into chamber gap 218. The processed gas being supplied into chamber gap 218 may be excited into a plasma state by RF power supplied to the lower or upper electrode assembly. The plasma in chamber gap 218 may be confined by a confinement-ring assembly 220 that ma be configured with at least a set of confinement rings (220a, 220b, 220c, and 220d). The gaps between confinement rings (220a-d) may be controlled by the advance of a shaft 224. Neutral gas species in chamber gap 218 may pass through confinement-ring gaps (222a, 222b, 222c, and 222d) between the set of confinement rings (220a-d). Neutral gas species may be exhausted from the chamber by a vacuum pump (not shown to simplify illustration).

As shown in FIG. 2, the rate of gas flow across substrate (not shown) from gas distribution manifold 216 may affect the pressure in chamber gap 218. The overall gas flow conductance of the flow path from gas distribution manifold 216 to the exhaust may depend on several factors, including but not limited to, the number of confinement rings and the size of the gaps between the set of confinement rings.

As aforementioned, a number of leading-edge process applications requiring an ultra-short gas residence time where one or more steps of the process may require flow conductance levels that may exceed the maximum capacity of the gap control. In light of such problem, the gas flow rate may be increased by employing additional gas flow conductance paths in parallel with the gas flow paths from gas distribution manifold 216 through the set of confinement-ring gaps (222a-d). The expanded, gas flow conductance paths may be configured in a gas flow bypass/conductance assembly 260, as shown in FIG. 2. Gas flow bypass/conductance assembly 260 may be configured with at least an aluminum ground extension ring 210, a rotable, choke ring 230 and a quartz cover ring 212.

In the example of FIG. 2, expanded gas flow bypass/conductance assembly 260 may be configured with expanded, gas flow conductance paths to increase gas flow rate through chamber gap 218. Expanded, gas flow conductance paths may be configured in aluminum ground extension ring 210 as a set of radial slots. Aluminum ground extension ring 210 may be separated from a focus ring 202 by an insulator ring 208. Aluminum ground extension ring 210 may be configured with a first set of bypass slots (210a, 210b, 210c, 210d, and 210e) as gas flow conductance paths. The first set of bypass slots (210a-e) may be radial slots extending in the radial direction of the ground extension ring 210.

As shown in FIG. 2, aluminum ground extension ring 210 may be protected from plasma by quartz cover ring 212. Quartz cover ring 212 may be configured with a second set of radial bypass slots (212a, 212h, 212c, 212d, and 212e). The second set of bypass radial slots (212a-e) of the quartz cover ring may be aligned with direct line of sight to first set of bypass slots (210a-e) of ground extension ring to allow increased gas flow though the expanded gas flow conductance paths.

To regulate gas flow through expanded, gas flow conductance path, gas flow bypass/conductance assembly 260 may also be configured with rotable, choke ring 230. Rotable choke ring 230 may be mounted in a ring-shaped channel formed in ground extension ring 210 and cover ring 212. Rotable, choke ring 230 may be configured with a third set of radial bypass slots (230a, 230b, 230c, 230d, and 230e). Rotatable, bypass choke ring 230 may be made of a dielectric material, such as quartz or silicone carbide. Rotatable, bypass choke ring 230 may be rotated relative to stationary aluminum ground extension ring 210 and stationary quartz cover ring 212 to control gas flow through a plurality of sets of aligned bypass slots (210a-e, 212a-e, and 230a-e).

In the ON state, rotable choke ring 230 with third set of bypass slots (230a-e) may be aligned with the first set of radial slots (210a-d) of aluminum ground extension ring 210 and the second set of radial slots (212a-d) of the quartz covered ring 212 to allow for fluid communication between first set of slots (210a-d) with second set of slots (212a-d) creating a plurality of gas flow conductance paths. Gas from chamber gap 218 may flow through the first and second sets of slots. Thus, in the ON state, gas may be allowed to flow through expanded, gas flow paths to allow for a higher gas conductance range.

In the OFF state, rotable choke ring 230 may be rotated to a position such that the alignment of the first set of slots (210a-e) do not have direct line of sight with second set of slots (212a-e). The first set of slots (210a-e) may be blocked by rotable choke ring 230 such that there may be no fluid communication between first set of slots (210a-e) with second set of slots (212a-e). Thus, the plurality of gas flow conductance paths ma), be blocked by rotable choke ring 230. Gas from chamber gap 218 may not be able to flow through the blocked conductance paths.

As can be appreciated from the foregoing, the expanded, variable gas flow conductance assembly ma provide the plurality of gas flow conductance paths to increase gas flow conductance range across the substrate. By increasing gas flow conductance in a plasma processing chamber, the plasma condition may be controlled quickly and accurately. By employing rotable choke ring 230, the plurality of gas flow conductance paths may be turn ON and/or OFF.

In general, additional hardware and software (not shown) may be required to control rotable, bypass choke ring 230. For example, additional mechanical control hardware may require at least an actuator to provide motion control for choke ring 230. Additional electrical control hardware may require at least input/output channels for transmitting electrical signals. In addition, software algorithms may be required to acquire user inputs, e.g., predetermined flow rate, and/or to control mechanical and electrical systems. Thus, additional control hardware and/or software may add cost and complexity to the system.

As can be appreciated by those skilled in the art, choke ring with bypass slots made from quartz may be expensive to manufacture. In addition, moving part, e.g., rotable, choke ring, in the path of gas flow may generate unintended contamination that may result in uncontrolled process variation, which may reduce yield in manufacturing.

Although rotable, quartz choke ring may provide a mechanism to regulate increased gas flow through expanded, gas flow conductance assembly, the added cost and complexity of employing rotable, choke ring may require alternative solution for regulating increased gas flow through expanded, gas flow conductance assembly.

Thus, the inventor herein realized that existing confinement-ring assembly may be modified to regulate increased gas flow through expanded, gas flow conductance assembly while controlling pressure in processing chamber.

Figure 3A:
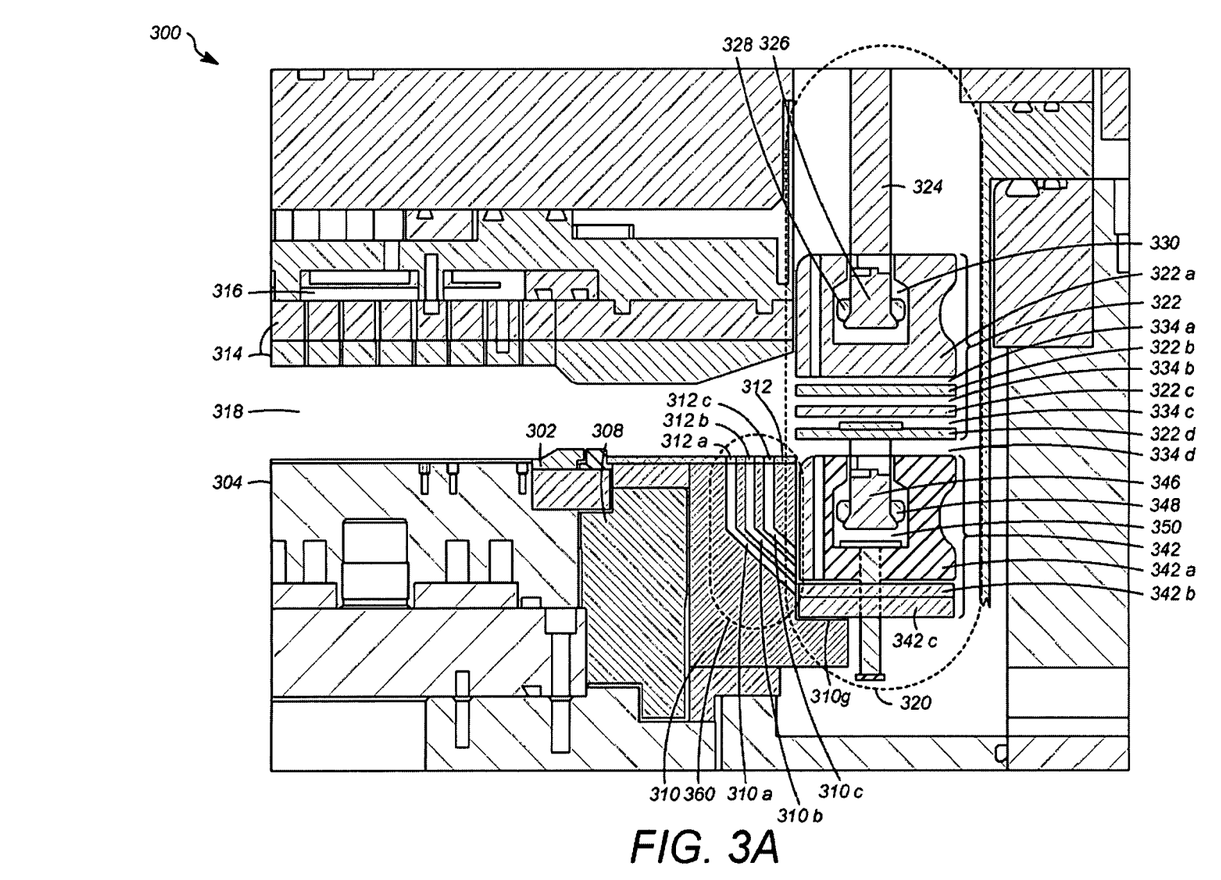
FIG. 3A shows, in accordance with an embodiment of the present invention, a simplified schematic of a plasma processing system configured with an expanded, gas flow conductance assembly and a modified, confinement-ring assembly with a set of lower confinement rings in the collapsed, OFF position.
Figure 3B:
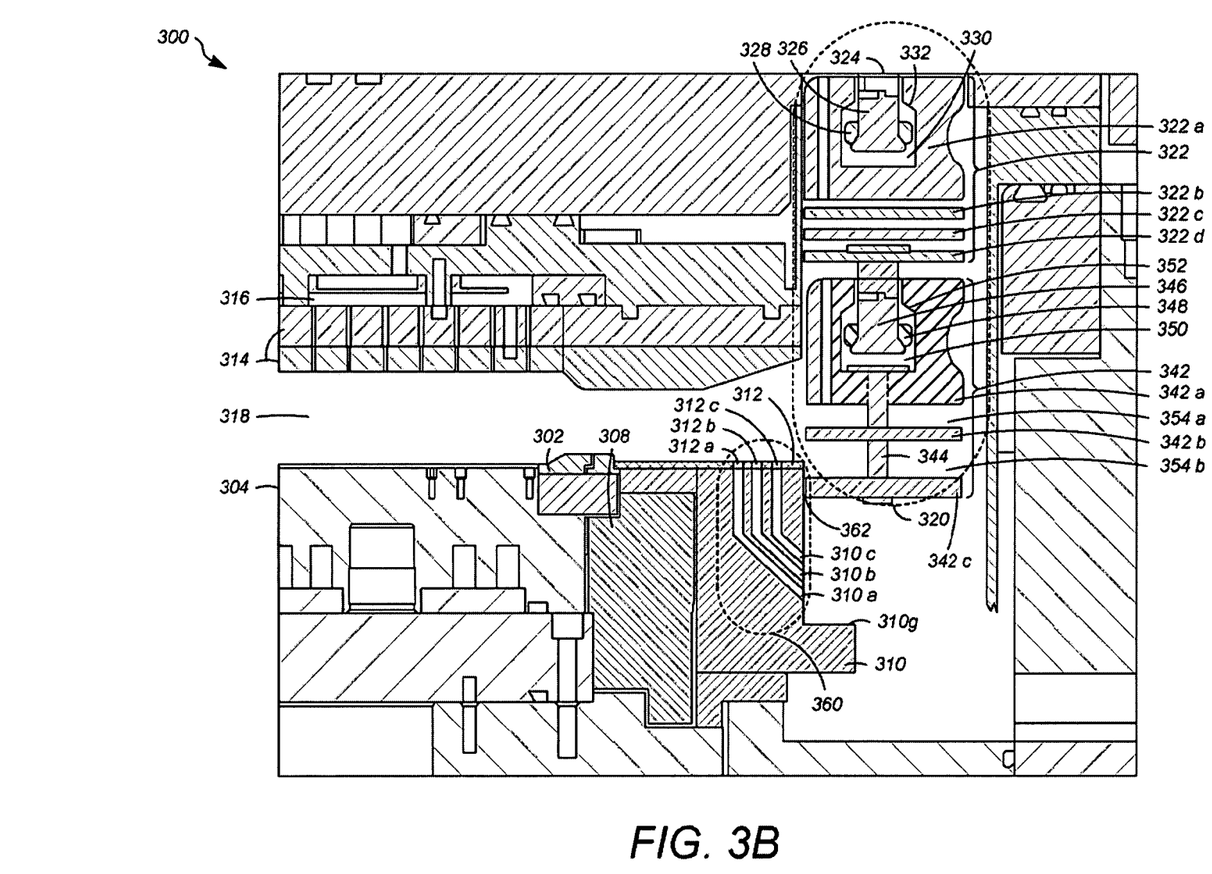
FIG. 3B shows, in accordance with an embodiment of the present invention, a simplified schematic of a plasma processing system configured with an expanded, gas flow conductance assembly and the modified, confinement-ring assembly with a set of lower confinement rings in the expanded, ON position.

FIGS. 3A and 3B are discussed together to illustrate alternative apparatus and methods to regulate increased, gas flow. FIG. 3A shows, in accordance with an embodiment of the present invention, a simplified schematic of a plasma processing system configured with an expanded, gas flow conductance assembly and a modified, confinement-ring assembly with a set of lower confinement rings in the collapsed, OFF position. In the OFF position, the bypass is also shut OFF. FIG. 3B shows, in accordance with an embodiment of the present invention, a simplified schematic of a plasma processing system configured with an expanded, gas flow conductance assembly and the modified, confinement-ring assembly with a set of lower confinement rings in the expanded, ON position. In the ON position, the bypass is now turned ON.

Referring to FIG. 3A, plasma processing system 300 may be a capacitively-coupled plasma (CCP) processing system and/or an inductively coupled system (ICP). In an example, plasma processing system 300 may be a single, double, or triple or multiple frequency capacitively discharged system. For example, radio frequencies (RF) may include, but are not limited to, 2, 27 and 60 megahertz (MHz).

For example, the plasma processing system 300 may be configured with at least an upper electrode assembly and a lower electrode assembly with a chamber gap 318 in between the upper electrode assembly and the lower electrode assembly.

The lower electrode assembly may include at least a focus ring 302 and an ESC 304. In the implementation of FIG. 3A, ESC 304 may be employed to hold a substrate (not shown) in place during plasma processing. Furthermore, the lower electrode assembly may be configured with an expanded, gas flow bypass/conductance assembly 360.

As shown in FIG. 3A, expanded, gas flow bypass/conductance assembly 360 may be configured with an aluminum ground extension ring 310 and a dielectric, quartz cover ring 312. Aluminum ground extension ring 310 may be separated from focus ring 302 by an insulator ring 308. In the implementation of FIG. 3A, aluminum ground extension ring 310 may be configured to concentrically surround the lower electrode. In an embodiment, aluminum ground extension ring 310 may be configured to include a plurality of radial slots (310a, 310b, and 310c) that may be employed to allow for increased gas flow.

Although only three radial slots (310a, 310b and 310c) are discussed in connection to FIG. 3A, the aluminum ground extension ring 310 may include any number of radial slots as bypass slots for expanded, gas flow conductance paths, in an embodiment. In an example, the number of bypass slots may typically be dozens of slots. In the implementation of FIG. 3A, the slots may have any suitable shapes, e.g., rectangular or trapezoidal, in an embodiment.

Aluminum ground extension ring 310 may be protected from plasma by dielectric, quartz cover ring 312, which may be disposed over ground extension ring 310. Quartz covered ring 312 may be configured to include a plurality of radial slots (312a, 312b, and 312c) that may be employed for expanded gas flow. As may be appreciated from the foregoing, the quartz covered ring 312 may include any number of radial slots as bypass slots for expanded, gas flow conductance paths. Thus, expanded, gas flow by pass/conductance assembly 360 may be configured with sets of slots (310a-c and 312a-c) formed therein to allow for increased gas flow rate.

In contrast to the expanded, gas flow bypass/conductance assembly 260 in the prior art of FIG. 2, the rotable, choke ring may be eliminated from expanded, gas flow bypass/conductance assembly 360. Increased gas flow through expanded, gas flow bypass/conductance assembly 360 may be regulated by a modified, confinement-ring assembly 320.

In the implementation of FIG. 3A, the upper electrode assembly mW include at least an upper electrode 314, which may be built like a shower head. Upper electrode 314 may be grounded (not shown to simplify illustration) during plasma processing. A processed gas is applied into chamber gap 318 through a gas distribution manifold 316. The gas may be electrically excited into plasma by RF power from an RF generator (not shown to simplify illustration) through the lower electrode assembly.

In an embodiment, plasma processing system 300 may be configured with modified, confinement-ring assembly 320 to regulate gas flow through expanded, gas flow bypass/conductance assembly 360 in the ground extension. The modified, confinement-ring assembly 320 may be configured to include at least two sets of collapsible confinement rings, i.e., a set of upper confinement rings (UCR) 322 and a set of lower confinement rings (LCR) 342, in an embodiment. The set of LCR 342 may be configured to couple to the set of UCR 322, in an embodiment. In the implementation of FIGS. 3A and 3B, the confinement rings may be formed from materials compatible with the plasma process, in an embodiment. In an embodiment, a compatible material for confinement rings may include, but not limited to, quartz.

Consider the situation, wherein, for example, during plasma processing, low gas flow and high pressure may be desired in one or more of the processing steps. An UCR shalt 324 may be driven down such that confinement rings (342a, 342b, and 342c) of the LCR set 342 may collapse in an OFF position blocking the gas flow through expanded, gas flow bypass/conductance assembly 360. The mechanism for collapsing and/or expanding confinement rings is discussed in greater detail below.

In the OFF position, the set of collapsed, LCR 342 may be disposed on a shoulder 310g of aluminum ground extension ring 310. In the collapsed position of lower confinement-rings set 342, an upper surface of the top confinement ring 342a of LCR set 342 may line up flush with the surface of the quartz covered ring 312. When the confinement rings (342a-c) of LCR set 342 are in the collapsed position, the side of LCR set 342 may completely block the outlet ends of bypass slots (310a-c), in an embodiment. Thus shutting OFF gas flow through the plurality of the bypass slots of the expanded, variable gas flow bypass/conductance assembly 360.

In the OFF position of the implementation of FIG. 3A, the neutral gas species in chamber gap 318 may, mainly flow through the set of confinement-ring gaps (334a, 334b, 334c, and 334d) of UCR (322a-d), in an embodiment the gas flow conductance, i.e., pressure in the chamber, may be controlled by adjusting the UCR gaps (334a-d). The gas flow conductance through the set of confinement-ring gaps (334a-d) may be proportional to the square of the height of the gaps.

In the implementation of FIG. 3A, the UCR gaps (334a-d) may be adjusted by collapsing the set of UCR gaps (334a-d) in series, in an embodiment. For example, UCR shaft 324 may be moved down forcing an UCR piston 326, configured with an o-ring 328, to move dozen in an UCR chamber 330 providing a mechanism for collapsing UCR gaps. As may be appreciated from the foregoing, the collapsing of the rings may be driven by the weight of the rings. The piston may serve as a suspension point that may move in vertical direction, which may be driven by the shaft. The lowest UCR gap 334d may be collapsed first when UCR piston 326 is moved down into UCR chamber 330. The UCR gaps may be collapsed sequentially from the lowest gap 334d, to the next lowest gap 334c, follow by the next lowest gap 334b, finally collapsing the top gap 334a, in an embodiment.

Hence, the gaps may be collapsed in series, with the lowest gap collapsing first, followed by the next lower gap, followed by the next gap, and followed by the uppermost top gap. In the implementation of FIG. 3A, LCR set 342 may be coupled to UCR set 322 through the lowest UCR 322d and a LRC piston 346, in an embodiment. The pocket of LCR chamber 350 may be configured to be sufficiently deep such that LCR piston 346, configured with an o-ring 348, may not smash down on LCR set (342a-d).

As can be appreciated by the foregoing, gas flow rate from chamber gap 318 may be controlled by varying the height of the set of UCR gaps (334a-d) in the OFF position, in an embodiment. The set of UCR gaps (334a-d) may collapse and/or expand, in series, to control the gap size without lifting the set of LCR 342, which may open the bypass slots for expanded, gas flow.

In the OFF position, the UCR set 322 may be in the gas flow area while LCR set 342 sits on the shoulder 310g of aluminum ground extension ring 310, in an embodiment. The LCR set 342 may be configured to shut off the set of bypass slots preventing expanded gas flow. The UCR set 322 gaps may be configured to be adjustable to control pressure. The pressure may be varied by collapsing and/or opening the set of gaps (334a-d) of UCR 334 in series to control gap size without lifting the lower confinement-ring set. However, gas flow rate may be limited to the height of UCR gaps (334a-d). In general, gap height may be limited to about 2× the sheath thickness of plasma to prevent unconfinement of plasma.

Consider the situation wherein, for example, one or more steps of the process may require flow conductance levels that exceed the maximum capacity of the UCR gaps (334a-d). The gas flow rate may be increased by employing additional gas flow conductance paths in expanded, gas flow bypass/conductance assembly 360, in an embodiment. In accordance with an embodiment of the invention, LCR set 342 may be pulled up, in an ON position, to open the gas flow through expanded, gas flow bypass/conductance assembly 360.

Referring to FIG. 3B, the UCR shaft 324 may be actuated to pull up UCR piston 326 being coupled to UCR shaft 324 allowing for an expanding of the UCR gaps due to the weights of the rings, in accordance with an embodiment of the invention. In an embodiment, UCR piston 324 may be pulled up in UCR chamber 330 against an UCR shoulder flange 332 moving UCR set 322 out of the gas flow path. The O-ring 328 may be employed to separate UCR piston 324 from UCR shoulder flange 332, in an embodiment. In an example, the O-rings may be employed to protect the quartz materials from being chipped by the metal piston. In the ON position, UCR set 322, having been moved out of the gas flow path, may no longer play a role in the gas flow regulation, in accordance with an embodiment of the invention.

As shown in FIG. 3B, the LCR piston 346, configured with o-ring 348, may be coupled to the lowest ring 322d of UCR set 322, in an embodiment. Being coupled to the lowest ring 322d of UCR set 322, LCR piston 346 may be employed to pull up LCR set 342 when shaft 324 is actuated to move up providing a mechanism for expanding LCR gaps, in an embodiment. The LCR set 342 may be moved into the gas flow path and opening up the outlet ends of bypass slots (310a-c) of expanded, gas flow bypass/conductance assembly 360. Thus, in the ON position with LCR set 342 being pulled up to unblock bypass slots (310a-c), gas flow rate may be increased by flowing gas species through the plurality of the bypass slots of the expanded, gas flow bypass/conductance assembly 360, in an embodiment.

In accordance with an embodiment of the invention, as shown in FIG. 3B, neutral gas species from chamber gap 318 may flow through bypass slots of expanded gas flow bypass/conductance assembly 360 and/or through the set of confinement-ring gaps 354a and 354b of LCR 342a-c. In an embodiment, the gas flow conductance, i.e., pressure in the chamber, may be controlled by adjusting the position of the LCR gaps 354a-b of LCR set 342 along the height of the gas flow path.

In the implementation of FIG. 3B, the LCR set 342 may be configured with gap 354a, an upper gap on LCR set, and gap 354b, a lower gap on LCR set. The upper gap 354a may be configured to have a different height than the lower gap 354b on LRC set 342. The pressure in the chamber may be adjusted by moving LCR piston 348 through UCR shaft 332 to position LCR gaps 354a-b in the gas flow path. Depending on the vertical position of LCR gaps (354a-b) in the gas flow path, the pressure in the chamber may be controlled by LCR gaps (354a-b), in an embodiment.

As aforementioned, the gap height may be correlated to gas flow conductance. In general, gas conductance through a gap, for example, may be equal to about the square of the height of the gap. In an example, as shown in FIG. 3B, lower confinement-ring gaps 354a and 354b may be configured to have different heights. The ratio of gap height of gap 354b to gap 354a may be about 2:1. The resulting flow conductance may be about 4:1 through the gaps. As can be appreciated by those skilled in the art, the number of confinement rings, gaps and gap height may be tailored to achieve the desired process range for gas flow rate, in an embodiment. How ever, the gap may be limited to a maximum height of about two times (2×) the plasma sheath thickness to prevent plasma unconfinement, in an embodiment.

Consider the situation wherein, for example, LCR gaps 354a-b may be at the maximum height in the chamber gas flow path to achieve maximum gas flow. The thickness of the lowest confinement ring 342c of LCR set 342 may be configured with a predetermined thickness to provide sufficient overlap with the vertical outer sidewall of the aluminum ground extension ring 310, in an embodiment. By providing sufficient overlapping, a gap 362, i.e., the gap between lower confinement ring 342c and aluminum ground extension ring sidewall 310, may be less than about two times (2×) the sheath thickness to prevent plasma unconfinement, in accordance with an embodiment of the invention.

In the OFF position, confinement-ring assembly 320 may provide for low gas flow and high pressure where LCR set 342 may be employed in the collapsed state to block off gas flow through the expanded, gas flow bypass/conductance assembly 360. The pressure in the chamber may be controlled through the UCR set 322 through adjusting the height of each gap of UCR gaps (322a-d).

In the ON position, confinement-ring assembly 320 may provide for high gas flow and low pressure where LCR set 342 may be pulled up to unblock bypass slots (310a-c). With the bypass slots (310a-c) unblocked gas flow rate may increase by flowing gas species through the plurality of the bypass slots of the expanded, gas flow bypass/conductance assembly 360. The UCR set 322 may be pulled out of the way and may not play a role in the flow control. The pressure in the chamber may be controlled through adjusting the vertical position of the LCR gaps (354a-b) of LCR set 342 along the height of the gas flow path.

As can be appreciated from the foregoing, the modified, confinement-ring assembly may be employed to regulate expanded gas flow rate and/or control pressure. As a result, rotatable, bypass choke ring may be eliminated from expanded, gas flow bypass/conductance assembly. Therefore, additional actuator, I/O ports, and/or control software algorithm may not be required. Since quartz choke ring may be eliminated, the risk of generating particles in the plasma process may be minimized. With less moving parts, the probability of particle contamination may be reduced, therefore, increasing the yield of the application. Thus, the cost and complexity to the plasma processing system may be reduced by employing the modified, confinement-ring assembly.

Furthermore, a plasma processing system configured with the modified, confinement-ring assembly with a plurality of sets of confinement rings may allow substrate to be processed in both low gas flow rate and high pressure regimes and/or high gas flow rate and low pressure regimes in the same system. Thus, device manufacturer may not need to purchase several plasma processing systems to accommodate the need of processing substrate in a wide range of gas flow rate and/or pressure regimes.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. An apparatus for controlling gas flow conductance in a plasma processing chamber, the plasma processing chamber configured with an upper electrode disposed opposite a lower electrode adapted to support a substrate, the apparatus comprising:
   a ground ring configured to concentrically surround said lower electrode, said ground ring including a first set of radial slots formed therein;
   a confinement ring arrangement, said confinement ring arrangement including at least a first set of collapsible confinement rings and a second set of collapsible confinement rings, wherein a first ring of said first set of collapsible confinement rings includes a first chamber having disposed therein a first piston and a first ring of said second set of collapsible confinement rings includes a second chamber having disposed therein a second piston, said second set of collapsible confinement rings is configured to movably couple to said first set of collapsible confinement rings; and
   a mechanism configured at least to collapse and to expand said first set of collapsible confinement rings and said second set of collapsible confinement rings to control gas flow conductance through said first set of radial slots between
      (a) an ON state in which a gas flow through said first set of radial slots is unobstructed by said second set of collapsible confinement rings, and
      (b) an OFF state in which said gas flow through said first set of radial slots is obstructed by said second set of collapsible rings.

2. The apparatus of claim 1, wherein said ground ring is formed of a conductive material.

3. The apparatus of claim 2, wherein said conductive material is Aluminum.

4. The apparatus of claim 1, further comprising a cover ring disposed over said ground ring, said cover ring including a second set of radial slots formed therein.

5. The apparatus of claim 4, wherein said cover ring is formed of quartz.

6. The apparatus of claim 1, wherein at least one of said first set of collapsible confinement rings and said second set of collapsible confinement rings is formed of quartz.

7. The apparatus of claim 1, wherein said first set of collapsible confinement rings includes at least one confinement ring.

8. The apparatus of claim 7, wherein said first set of collapsible confinement rings is movable in a direction perpendicular to a planar surface of said ground ring to control gas flow through a first set of gaps between said first set of collapsible confinement rings.

9. The apparatus of claim 1, wherein said second set of collapsible confinement rings includes at least one confinement ring.

10. The apparatus of claim 9, wherein said second set of collapsible confinement rings is movable in a direction perpendicular to a planar surface of said ground ring to control gas flow through a second set of gaps between said first set of collapsible confinement rings.

11. The apparatus of claim 10, wherein said each gap in said second set of gaps between said first set of collapsible confinement rings is configured to have a different gap height.

12. The apparatus of claim 1, wherein said mechanism includes at least:
   a shaft coupled to said first piston,
   wherein said second piston is coupled to a second ring of said first set of collapsible confinement rings, and
   wherein at least one of said first set of collapsible confinement rings and said second set of collapsible confinement rings
      (i) expands when said shaft is moved upward in a direction perpendicular to a planar surface of said ground ring or
      (ii) collapses when said shaft is moved downward in the direction perpendicular to the planar surface of said ground ring.

13. A method of controlling flow conductance in a plasma processing chamber, said method comprising:

supporting a substrate in said plasma processing chamber configured with an upper electrode disposed opposite a lower electrode, said plasma processing chamber comprising an apparatus including at least:

a ground ring configured to concentrically surround said lower electrode, said ground ring including a first set of radial slots formed therein, a confinement ring arrangement, said confinement ring arrangement including at least a first set of collapsible confinement rings and a second set of collapsible confinement rings, wherein a first ring of said first set of collapsible confinement rings includes a first chamber having disposed therein a first piston and a first ring of said second set of collapsible confinement rings includes a second chamber having disposed therein a second piston, said second set of collapsible confinement rings is configured to movably couple to said first set of collapsible confinement rings, and a mechanism configured at least to collapse and to expand said first set of collapsible confinement rings and said second set of collapsible confinement rings to control gas flow conductance through said first set of radial slots between (a) an ON state in which a gas flow through said first set of radial slots is unobstructed by said second set of collapsible confinement rings, and (b) an OFF state in which said gas flow through said first set of radial slots is obstructed by said second set of collapsible rings;

exciting said gas into plasma; and operating said mechanism to control said gas flow conductance through said first set of radial slots and said second set of radial slots.

14. The method of claim 13, wherein said ground ring is formed of a conductive material.

15. The method of claim 14, wherein said conductive material is Aluminum.

16. The method of claim 13, wherein said apparatus further including at least a cover ring disposed over said ground ring, said cover ring including a second set of radial slots formed therein.

17. The method of claim 16, wherein said cover ring is formed of quartz.

18. The method of claim 13, wherein at least one of said first set of collapsible confinement rings and said second set of collapsible confinement rings is formed of quartz.

19. The method of claim 13, wherein said first set of collapsible confinement rings includes at least one confinement ring.

20. The method of claim 19, wherein said first set of collapsible confinement rings is movable in a direction perpendicular to a planar surface of said ground ring to control gas flow through a first set of gaps between said first set of collapsible confinement rings.

21. The method of claim 13, wherein said second set of collapsible confinement rings includes at least one confinement ring.

22. The method of claim 21, wherein said second set of collapsible confinement rings is movable in a direction perpendicular to a planar surface of said ground ring to control gas flow through a second set of gaps between said first set of collapsible confinement rings.

23. The method of claim 22, wherein said each gap in said second set of gaps between said first set of collapsible confinement rings is configured to have a different gap height.

24. The method of claim 13, wherein said mechanism includes at least:

a shaft coupled to said first piston, wherein said second piston is coupled to a second ring of said first set of collapsible confinement rings, and wherein at least one of said first set of collapsible confinement rings and said second set of collapsible confinement rings (i) expands when said shaft is moved upward in a direction perpendicular to a planar surface of said ground ring or (ii) collapses when said shaft is moved downward in a direction perpendicular to a planar surface of said ground ring.

* * * * *